United States Patent
Hwang et al.

(10) Patent No.: US 9,245,978 B2
(45) Date of Patent: Jan. 26, 2016

(54) SELF-ALIGNED THIN FILM TRANSISTOR WITH DOPING BARRIER AND METHOD OF MANUFACTURING THE SAME

(71) Applicant: Electronics and Telecommunications Research Institute, Daejeon (KR)

(72) Inventors: Chi Sun Hwang, Daejeon (KR); Sang Hee Park, Daejeon (KR); Him Chan Oh, Seoul (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 13/960,352

(22) Filed: Aug. 6, 2013

(65) Prior Publication Data

US 2014/0042539 A1    Feb. 13, 2014

(30) Foreign Application Priority Data

Aug. 7, 2012    (KR) .......................... 10-2012-0086234

(51) Int. Cl.
*H01L 27/12*    (2006.01)
*H01L 29/66*    (2006.01)
*H01L 29/786*    (2006.01)

(52) U.S. Cl.
CPC .... *H01L 29/66742* (2013.01); *H01L 29/66969* (2013.01); *H01L 29/7869* (2013.01); *H01L 29/78618* (2013.01)

(58) Field of Classification Search
CPC ..................... H01L 29/66742; H01L 29/7869; H01L 29/78618; H01L 26/66742; H01L 2224/73265; H01L 2924/13091; H01L 21/02164; H01L 29/66969; H01L 2924/00014; H01L 2224/32225; H01L 2924/12032; H01L 2224/48227

USPC ............ 257/35, 347, 374, 486, 751, E51.025, 257/E51.026, 59
See application file for complete search history.

(56) References Cited

U.S. PATENT DOCUMENTS 6,297,161 B1 * 10/2001 Sah ........................ H01L 29/458
                                                    257/E21.414
6,429,483 B1 *  8/2002 Teramoto ...................... 257/347

(Continued)

FOREIGN PATENT DOCUMENTS

KR    10-2001-0109211 A    12/2001
KR    10-2006-0079356         7/2006

OTHER PUBLICATIONS

Cheng-Han Wu et al., "Self-Aligned Top-Gate Coplanar In—Ga—Zn—O Thin-Film Transistors", Journal of Display Technology, Dec. 2009, pp. 515-519, vol. 5, No. 12.

(Continued)

*Primary Examiner* — Yosef Gebreyesus
(74) *Attorney, Agent, or Firm* — Rabin & Berdo, P.C.

(57) ABSTRACT

Disclosed are a self-aligned thin film transistor controlling a diffusion length of a doping material using a doping barrier in a thin film transistor having a self-aligned structure and a method of manufacturing the same. The self-aligned thin film transistor with a doping barrier includes: an active layer formed on a substrate and having a first doping region, a second doping region, and a channel region; a gate insulating film formed on the channel region; a gate electrode formed on the gate insulating film; a doping source film formed on the first doping region and the second doping region; and a doping barrier formed between the doping source film and the first doping region and between the doping source film and the second doping region.

14 Claims, 4 Drawing Sheets

(56) References Cited

U.S. PATENT DOCUMENTS

| | | | |
|---|---|---|---|
| 2007/0040173 A1* | 2/2007 | Kugimiya ......... H01L 23/53219 | 257/59 |
| 2007/0287237 A1* | 12/2007 | Rockenberger et al. ...... 438/163 | |
| 2010/0096633 A1* | 4/2010 | Hatano et al. .................... 257/59 | |
| 2011/0068340 A1* | 3/2011 | Lee et al. ........................ 257/59 | |
| 2011/0309510 A1* | 12/2011 | Lee et al. ....................... 257/751 | |
| 2012/0146032 A1* | 6/2012 | Lee .................... H01L 27/3248 | 257/59 |

OTHER PUBLICATIONS

Zhi Ye et al., "Zinc—Oxide Thin-Film Transistor With Self-Aligned Source/Drain Regions Doped With Implanted Boron for Enhanced Thermal Stability", IEEE Transactions on Electron Devices, Feb. 2012, pp. 393-399, vol. 59, No. 2.

\* cited by examiner

SELF-ALIGNED THIN FILM TRANSISTOR WITH DOPING BARRIER AND METHOD OF MANUFACTURING THE SAME

CROSS-REFERENCE TO RELATED APPLICATIONS

This application is based on and claims priority from Korean Patent Application No. 10-2012-0086234, filed on Aug. 7, 2012, with the Korean Intellectual Property Office, the disclosure of which is incorporated herein in its entirety by reference.

TECHNICAL FIELD

The present disclosure relates to a self-aligned thin film transistor with a doping bather and a method of manufacturing the same, and more particularly, to a self-aligned thin film transistor capable of controlling a diffused degree of a doping material using a doping barrier in a thin film transistor with a self-aligned structure and a method of manufacturing the same.

BACKGROUND

A thin film transistor based on a thin film deposition technology, which is mainly used as a backplane element of a flat panel display, has been continuously developed. Recently, an oxide semiconductor thin film transistor using a metal oxide semiconductor has received a lot of attention.

In order to manufacture the thin film transistor, a process of forming an oxide film that is a channel layer and a process of forming a source region and a drain region by adding hydrogen to a part of the oxide film are required.

As illustrated in FIG. 1, a self-aligned thin film transistor 10 according to the related art includes a substrate 100, an active layer 110, a doping source film 130, a gate insulating film 140, a gate electrode 150, an interlayer insulating film 160, a source electrode 172, and a drain electrode 174.

As illustrated in FIG. 1, in the self-aligned thin film transistor according to the related art, a source region 122 and a drain region 124 are formed by depositing a doping source film 130 in a region in which the source electrode 172 and drain electrode 174 contacts the substrate 100.

However, in the method, a diffusion of hydrogen used for the doping occurs during subsequent processes, such that a doping region (i.e., a doped region) may be formed in a region wider than a region that is actually needed. The wide doping region penetrates into a bottom portion of the gate insulating film 140 through the gate electrode 150 to hinder an effect of removing the overlap between the gate and source regions and between the gate and drain regions, which is an advantage of the self-aligned structure. The expansion of the doping region disadvantageously affects the self-aligned device structure. That is, when the device length of the thin film transistor is short, a short channel effect is generated due to the expanded doping region and in more severe cases, the doping regions are connected with each other within the channel such that the operation of the device may be hindered.

Therefore, a need exists for a structure for effectively preventing the expansion of the doping region. However, there is a need to sufficiently consider subsequent processes because the expansion of the doping region continuously occurs due to the subsequent thermal process of the device.

SUMMARY

The present disclosure has been made in an effort to provide a transistor with high current drivability and excellent uniformity, by preventing an expansion of an unnecessary doping region occurring when a self-aligned structure is formed using a doping source film.

An exemplary embodiment of the present disclosure provides a self-aligned thin film transistor with a doping barrier, including: an active layer formed on a substrate and having a first doping region, a second doping region, and a channel region; a gate insulating film formed on the channel region; a gate electrode formed on the gate insulating film; a doping source film formed on the first doping region and the second doping region; a doping barrier formed between the doping source film and the first doping region and between the doping source film and the second doping region; and an interlayer insulating film formed on the doping source film and the gate electrode and having a first contact hole and a second contact hole.

The self-aligned thin film transistor with a doping barrier may further include an interlayer insulating film formed on the doping source film and the gate electrode and having a first contact hole and a second contact hole; a source electrode formed on the interlayer insulating film and connected with the first contact hole and the first doping region; and a drain electrode formed on the interlayer insulating film and formed in the second contact hole and the second doping region.

The doping barrier may be a passivation film that encloses the gate insulating film and the gate electrode.

Another exemplary embodiment of the present disclosure provides a method of manufacturing a self-aligned thin film transistor with a doping barrier, including: forming an active layer having a channel region on a substrate; forming a gate insulating film on the channel region; forming a gate electrode on the gate insulating film; forming a doping barrier at a position at which a source electrode and a drain electrode are formed in the active layer; forming a doping source film on the doping barrier; and forming an insulating film on the gate electrode and the doping source film.

The method of manufacturing a self-aligned thin film transistor with a doping barrier may further include: forming a first contact hole and a second contact hole each connected with the source region and the drain region on the insulating film; and forming the source electrode and the drain electrode in the first contact hole and the second contact hole.

In the forming of the doping barrier, a thickness of the doping barrier may be determined according to a diffused degree of dopant.

The diffused degree of the dopant may be changed according to a kind and a process temperature of the dopant.

According to the exemplary embodiment of the present disclosure, it is possible to achieve the doping method stabilized against the subsequent thermal process of the device by controlling the diffusion of the doping elements based on the deposition of the barrier that is an inexpensive process and cope with the subsequent thermal process by controlling the thickness of the barrier according to the heat treatment temperature of the device.

According to the exemplary embodiment of the present disclosure, it is possible to reduce the overlap portion between the gate electrode and the source and drain regions of the metal oxide transistor by controlling the diffusion of the doping material to reduce and even the parasitic capacitance of the transistor, thereby manufacturing the transistor with the high current drivability and the excellent uniformity.

The foregoing summary is illustrative only and is not intended to be in any way limiting. In addition to the illustrative aspects, embodiments, and features described above, fur-

DETAILED DESCRIPTION

Figure 1:
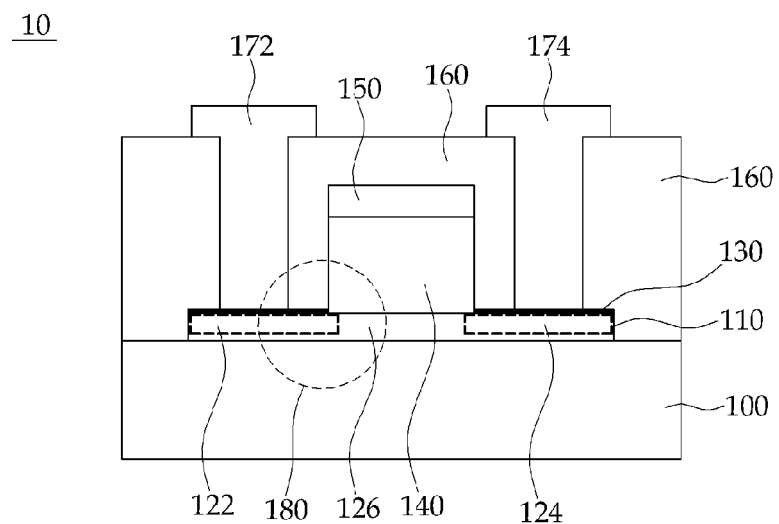
FIG. 1 is a cross-sectional view illustrating a self-aligned thin film transistor according to the related art.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Hereinafter, exemplary embodiments of the present disclosure will be described in detail with reference to the accompanying drawings. Hereinafter, a configuration and an acting effect of exemplary embodiments of the present disclosure will be clearly understood through the following detailed description. Prior to the detailed description of exemplary embodiments of the present disclosure, it is to be noted that like reference numerals refer to like elements even though like elements are shown in different drawings and well-known functions or constructions will not be described in detail since they may unnecessarily obscure the understanding of the present disclosure.

Figure 2:
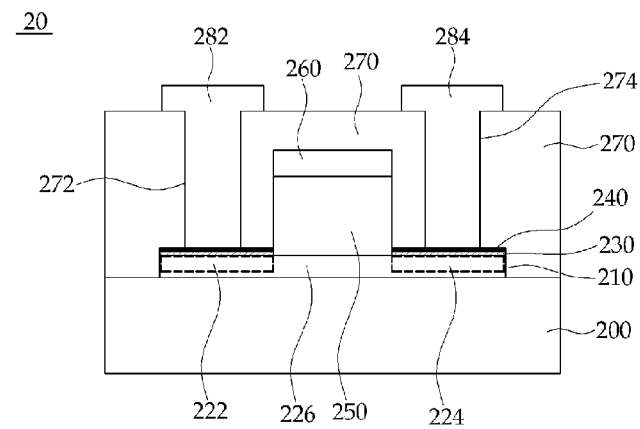
FIG. 2 is a cross-sectional view illustrating a self-aligned thin film transistor with a doping barrier according to an exemplary embodiment of the present disclosure.

FIG. 2 is a cross-sectional view illustrating a self-aligned thin film transistor substrate with a doping bather according to an exemplary embodiment of the present disclosure.

Referring to FIG. 2, a self-aligned thin film transistor 20 with a doping barrier according to an exemplary embodiment of the present disclosure includes a substrate 200, an active layer 210, a doping barrier 230, a doping source film 240, a gate insulating film 250, a gate electrode 260, an interlayer insulating film 270, a source electrode 282, and a drain electrode 284.

The substrate 200 is not particularly limited, but may be made of glass or a polymer material having flexibility and insulation.

The active layer 210 includes a first doping region 222 (i.e., a first doped region), a second doping region 224 (i.e., a second doped region), and a channel region 226, and the channel region 226 is located between the first doping region 222 and the second doping region 224.

The doping source film 240 is formed on the active layer so as to dope a region in which the source electrode and the drain electrode contact each other.

The doping barrier 230 is formed to delay the diffusion of doping materials (hydrogen, and the like) in the doping source film 240 and control the diffused amount thereof.

In this case, it may be determined how much the doping materials may be diffused due to subsequent processes, by controlling a kind and a thickness of the doping barrier 230. Therefore, when a temperature of the subsequent process is increased, a material that is not easily diffused is used or the thickness of the material makes the thickness of the doping barrier 230 thick. On the other hand, when the temperature of the subsequent process is reduced, the doping can be easily performed by reducing the thickness of the doping barrier film.

In a case of the self-aligned thin film transistor 20 with the doping barrier 230 illustrated in FIG. 2, the diffused degree of the doping material can be controlled, such that it is possible to prevent a short channel effect and a malfunction of a device due to the excessive expansion of the doping region according to the subsequent processes.

It is possible for the doping barrier 230 to prevent the damage of the active layer 210 that may occur during the deposition process of the doping source film 240.

Figure 3:
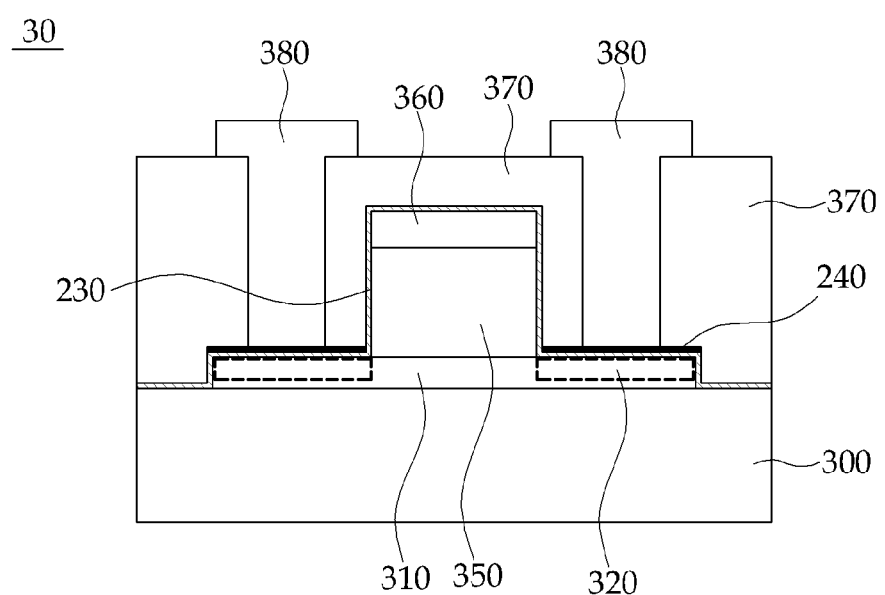
FIG. 3 is a cross-sectional view illustrating the self-aligned thin film transistor with the doping barrier acting as passivation according to an exemplary embodiment of the present disclosure.

As illustrated in FIG. 3, in the actual manufacturing process, a doping barrier 330 encloses a gate insulating film 350 and a gate electrode 360 and may thus serve as a passivation film (330 of FIG. 3) for a thin film transistor 30.

The gate insulating film 250 is formed on the active layer 210 and if a material of the gate insulating film 250 has good insulation, the material is not particularly limited. The gate insulating film 250 includes a source contact hole 272 and a drain contact hole 274.

The gate electrode 260 is formed on the gate insulating film in the channel region 226. Any material with conductivity may be used for the gate electrode.

The source electrode 282 and the drain electrode 284 are disposed on the interlayer insulating film 270 so as to be spaced apart from each other.

The source electrode 282 is formed on the interlayer insulating film 270 at a position corresponding to the first doping region 222 and the source electrode 282 is connected with the first doping region 222 through the source contact hole 272.

The drain electrode 284 is formed on the interlayer insulating film 270 at a position corresponding to the drain region 224 and the drain electrode 284 is connected with the drain region 224 through the drain contact hole 274.

Hereinafter, a method of manufacturing a self-aligned thin film transistor with a doping barrier according to another exemplary embodiment of the present disclosure will be described in detail with reference to FIGS. 4A to 4E.

FIGS. 4A to 4E are cross-sectional views illustrating a method of manufacturing a self-aligned thin film transistor with a doping barrier according to another exemplary embodiment of the present disclosure.

Figure 4A:
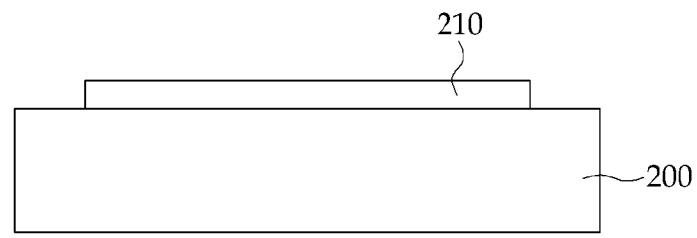
FIGS. 4A to 4E are cross-sectional views illustrating a method of manufacturing a self-aligned thin film transistor with a doping barrier according to an exemplary embodiment of the present disclosure.

Describing the method of manufacturing a self-aligned thin film transistor with a doping barrier with reference to FIG. 4A, first, an oxide film that is the active layer 210 is formed on the substrate 200 by patterning.

Figure 4B:
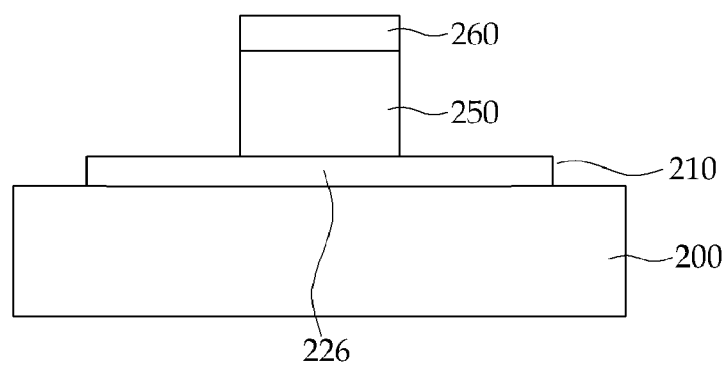

Next, as illustrated in FIG. 4B, the gate insulating layer 250 is deposited and the gate electrode 260 is formed on the gate insulating layer 250 by patterning. The gate electrode 260 has substantially the same area as the channel region 226 of the active layer 210 and overlaps the channel region 226 in a direction vertical to the substrate 200. The gate electrode 260 does not substantially overlap the first doping region 222 and the second doping region 224 that are formed later.

Figure 4C:
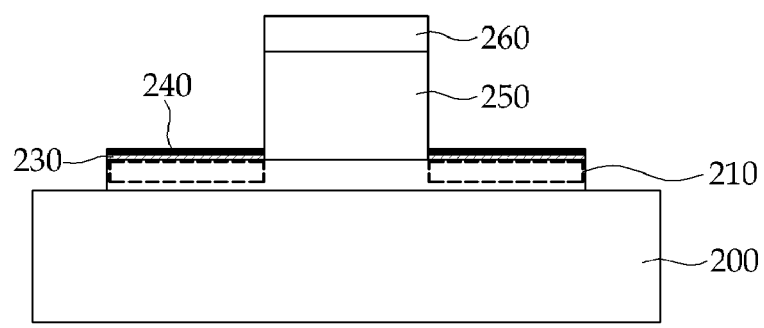

Next, as illustrated in FIG. 4C, the doping barrier 230 and the doping source film 240 are sequentially formed in the source region and the drain region that contact the source electrode and the drain electrode. The source region and the drain region may be formed to be self-aligned with the gate electrode by the deposition of the doping source film 240. It is possible to reduce the overlap portion between the gate electrode 260 and the first doping region 222 and the second doping region 224 while having the self-aligned characteristics, by controlling the diffusion of the doping material using the doping barrier 230.

Figure 4D:
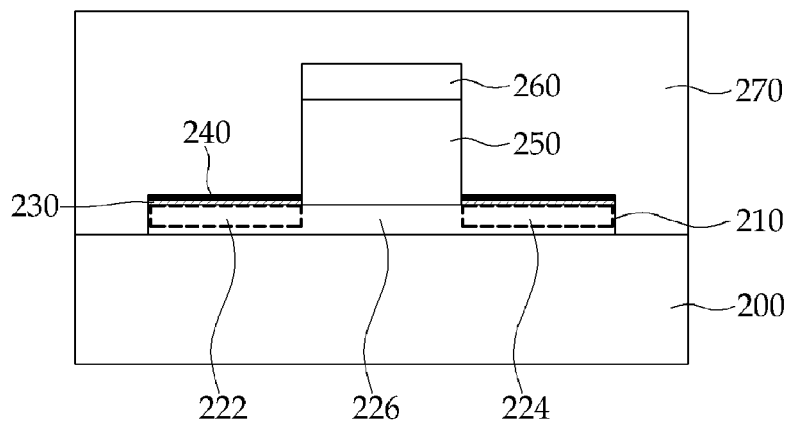

Next, as illustrated in FIG. 4D, the insulating material is deposited on the doping source film 240 and the gate electrode 260 to form the interlayer insulating layer 270. Next, the interlayer insulating layer 270 corresponding to each of the first doping region 222 and the second doping region 224 is etched to form the source contact hole 272 and the drain contact hole 274.

Figure 4E:
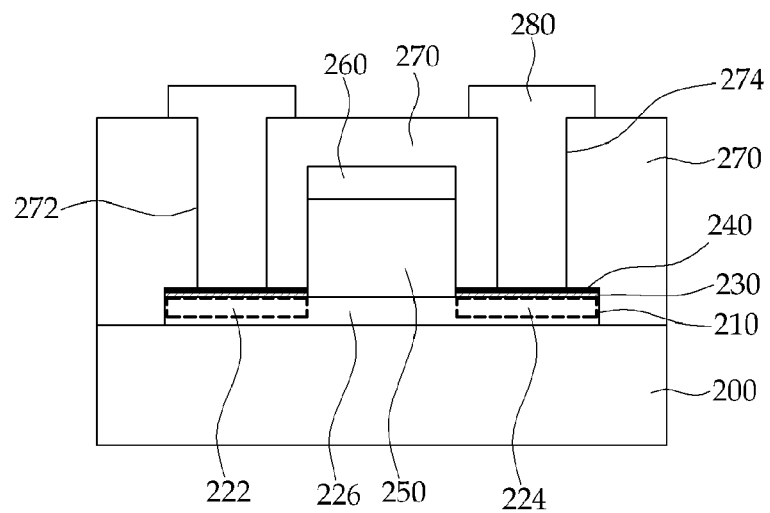

Next, as illustrated in FIG. 4E, the source electrode 282 and the drain electrode 284 are formed on the interlayer insulating layer 270. The source electrode 282 and the drain electrode 284 are each connected with the first doping region 222 that is the source region and the second doping region 224 that is the drain region, through the source contact hole 272 and the drain contact hole 274.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A self-aligned thin film transistor with a doping barrier, comprising:
 a substrate;
 an active layer on the substrate and having a first doped region, a second doped region, and a channel region, the first doped region being a source region and the second doped region being a drain region;
 a gate insulating film on the channel region;
 a gate electrode on the gate insulating film;
 a doping source film including first and second doping source film portions respectively on the first doped region and the second doped region;
 a doping barrier including
  a first doping barrier portion between the first doping source film portion and the first doped region, the first doping barrier portion being formed to delay diffusion and control an amount of doping materials diffusing from the first doping source film portion when forming the first doped region, and
  a second doping barrier portion between the second doping source film portion and the second doped region, the second doping barrier portion being formed to delay diffusion and control an amount of doping materials diffusing from the second doping source film portion when forming the second doped region; and
 source and drain electrodes provided so as to be electrically connected to the source and drain regions via the doping source film,
 wherein the first doping barrier portion and the first doped region are formed between the substrate and the source electrode,
 wherein the second doping barrier portion and the second doped region are formed between the substrate and the drain electrode, and
 wherein the gate insulating film is different from the first doping barrier portion and the second doping barrier portion.

2. The self-aligned thin film transistor of claim 1, further comprising an interlayer insulating film on the first and second doping source film portions and the gate electrode, and having a first contact hole and a second contact hole, wherein
 the source electrode is disposed on the interlayer insulating film and in the first contact hole to be connected with the source region; and
 the drain electrode is disposed on the interlayer insulating film and in the second contact hole to be connected with the drain region.

3. The self-aligned thin film transistor of claim 1, wherein the gate insulating film is directly under the gate electrode, and the first and second doped regions are directly under the first and second doping barrier portions, respectively, so that all of each of the first and second doped regions is disposed laterally with respect to the gate electrode.

4. The self-aligned thin film transistor of claim 1, wherein the source and drain electrodes are respectively electrically connected to the source and drain regions through the doping source film.

5. The self-aligned thin film transistor of claim 4, wherein the doping source film is interposed between the source region and the source electrode, and
 further wherein the doping source film is interposed between the drain region and the drain electrode.

6. The self-aligned thin film transistor of claim 5, wherein the doping barrier is interposed between the source region and the source electrode, and
 further wherein the doping barrier is interposed between the drain region and the drain electrode.

7. The self-aligned thin film transistor of claim 4, wherein the source electrode and the drain electrode are free of any direct contact with the source and drain regions.

8. The self-aligned thin film transistor of claim 1, wherein all of a bottom surface of the gate insulating film is in direct contact with the channel region.

9. A self-aligned thin film transistor with a doping barrier, comprising:
 a substrate;
 an active layer on the substrate and having a first doped region, a second doped region, and a channel region, the first doped region being a source region and the second doped region being a drain region;
 a gate insulating film on the channel region;
 a gate electrode on the gate insulating film;
 a doping source film on the first doped region and the second doped region; a doping barrier between the doping source film and the first doped region and between the doping source film and the second doped region; and
 source and drain electrodes provided so as to be electrically connected to the source and drain regions via the doping source film,
 wherein the gate insulating film is directly under the gate electrode, and the first and second doped regions are both directly under the doping barrier so that all of each of the first and second doped regions is disposed laterally with respect to the gate electrode,
 wherein a first doping barrier portion of the doping barrier, and the first doped region are formed between the substrate and the source electrode,
 wherein a second doping barrier portion of the doping barrier, and the second doped region are formed between the substrate and the drain electrode, and
 wherein the gate insulating film is different from the first doping barrier portion and the second doping barrier portion.

10. The self-aligned thin film transistor of claim 9, the source and drain electrodes are respectively electrically connected to the source and drain regions through the doping source film.

11. The self-aligned thin film transistor of claim 10, wherein the doping source film is interposed between the source region and the source electrode, and
   further wherein the doping source film is interposed between the drain region and the drain electrode.

12. The self-aligned thin film transistor of claim 11, wherein the doping barrier is interposed between the source region and the source electrode, and
   further wherein the doping barrier is interposed between the drain region and the drain electrode.

13. The self-aligned thin film transistor of claim 10, wherein the drain and source electrodes are free of any direct contact with the source and drain regions.

14. The self-aligned thin film transistor of claim 9, wherein all of a bottom surface of the gate insulating film is in direct contact with the channel region.

\* \* \* \* \*